United States Patent
Kimura et al.

(10) Patent No.: US 7,843,010 B2
(45) Date of Patent: Nov. 30, 2010

(54) CRYSTALLINE SEMICONDUCTOR FILM AND METHOD FOR MANUFACTURING THE SAME

(75) Inventors: Tomohiro Kimura, Matsusaka (JP); Takuto Yasumatsu, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 252 days.

(21) Appl. No.: 11/663,281

(22) PCT Filed: Jun. 21, 2005

(86) PCT No.: PCT/JP2005/011372

§ 371 (c)(1), (2), (4) Date: Mar. 20, 2008

(87) PCT Pub. No.: WO2006/038351

PCT Pub. Date: Apr. 13, 2006

(65) Prior Publication Data

US 2009/0140255 A1    Jun. 4, 2009

(30) Foreign Application Priority Data

Sep. 30, 2004    (JP) ............................. 2004-288830

(51) Int. Cl.
*H01L 23/62*    (2006.01)
*H01L 21/30*    (2006.01)

(52) U.S. Cl. ...................... 257/357; 438/455

(58) Field of Classification Search ........................ None
See application file for complete search history.

(56) References Cited

U.S. PATENT DOCUMENTS

| | | | |
|---|---|---|---|
| 6,677,222 B1 | 1/2004 | Mishima et al. | |
| 7,067,392 B2 * | 6/2006 | Yamazaki et al. | ........... 438/455 |
| 7,115,453 B2 * | 10/2006 | Nakamura et al. | .......... 438/166 |
| 2003/0162312 A1 * | 8/2003 | Takayama et al. | ............. 438/22 |
| 2004/0005742 A1 * | 1/2004 | Ohtani et al. | ............... 438/151 |
| 2004/0092061 A1 * | 5/2004 | Kawasaki et al. | ........... 438/166 |
| 2004/0124469 A1 | 7/2004 | Makita | |

FOREIGN PATENT DOCUMENTS

| | | |
|---|---|---|
| JP | 08-213637 | 8/1996 |
| JP | 11-354800 | 12/1999 |
| JP | 2000-101090 | 4/2000 |
| JP | 2000-340503 | 12/2000 |
| JP | 2001-060551 | 3/2001 |

(Continued)

OTHER PUBLICATIONS

International Search Report mailed Jul. 26, 2005 (Japanese and English Translation).

(Continued)

*Primary Examiner*—Charles D Garber
*Assistant Examiner*—Andre' C Stevenson
(74) *Attorney, Agent, or Firm*—Nixon & Vanderhye P.C.

(57) ABSTRACT

An island of a crystalline semiconductor according to the present invention has an upper surface and a sloped side surface, which are joined together with a curved surface. Crystal grains in a body portion of the island, including the upper surface, and crystal grains in an edge portion of the island, including the sloped side surface, both have average grain sizes that are greater than 0.2 µm.

22 Claims, 6 Drawing Sheets

FOREIGN PATENT DOCUMENTS

| | | |
|---|---|---|
| JP | 2001-094108 | 4/2001 |
| JP | 2003-142402 | 5/2003 |
| JP | 2003-151904 | 5/2003 |
| JP | 2003-297749 | 10/2003 |
| JP | 2004-128514 | 4/2004 |
| JP | 2004-179501 | 6/2004 |
| JP | 2004-207298 | 7/2004 |

OTHER PUBLICATIONS

English translation of the International Preliminary Report on Patentability mailed Apr. 12, 2007 in corresponding PCT Application No. PCT/JP2005/011372.

* cited by examiner (A)

(B)

(A)

(B)

(A)

(B)

(C)

12.50 µm = 25 steps (A)

12.50 µm = 25 steps (B)

(C)

CRYSTALLINE SEMICONDUCTOR FILM AND METHOD FOR MANUFACTURING THE SAME

This application is a U.S. national phase of International Application No. PCT/JP2005/011372 filed 21 Jun. 2005, which designated the U.S. and claims priority to JP 2004-288830 filed 30 Sep. 2004, the entire contents of each of which are hereby incorporated by reference.

TECHNICAL FIELD

The present invention relates to a crystalline semiconductor film, a method of making such a film, and a semiconductor device to be fabricated with the crystalline semiconductor film.

BACKGROUND ART

Recently, to realize an LCD or an organic EL display of a huge size and with high resolution, a high-speed and high-resolution image sensor, a three-dimensional IC and so on, research and development of fabricating high-performance semiconductor devices on either an insulating substrate such as a glass substrate or an insulating film has been carried on. Among other things, an LCD, including pixel portions and a driver on the same substrate, has been used as a monitor for not only personal computers (PCs) but also other general consumer electronic appliances. For example, more and more cathode-ray tubes (CRTs) have been replaced with LCDs as TV monitors and front projectors for viewing movies or enjoying games for amusement purposes have been purchased by an increasing number of general consumers nowadays, thus expanding the LCD market dramatically. Meanwhile, a so-called "system on panel" including a memory circuit and a logical circuit such as a clock generator that are integrated together on a glass substrate has also been researched and developed by a lot of engineers.

To present a high-resolution image, the amount of information to be written on pixels needs to be increased. And unless that huge amount of information is written in a short time, it is impossible to present the image, having an enormous amount of information to realize high-definition video, cannot be presented as moving pictures, for example. That is why a thin-film transistor (TFT) for use in a driver needs to operate very fast. And to realize such a high-speed operation, the TFT should be fabricated using a crystalline semiconductor film that has such a high degree of crystallinity as to realize sufficiently high field effect mobility.

Examples of known methods of forming a semiconductor film with good crystallinity on a glass substrate include a laser annealing process, in which an amorphous semiconductor film is irradiated with a laser beam such as excimer laser beam so as to be melted, solidified and crystallized instantaneously, and a solid-phase growth process, in which an amorphous semiconductor film is not heated to its melting point but thermally treated at around 600° C. to produce crystal growth. Besides these processes, a technique of forming a quality semiconductor film with highly aligned crystallographic orientations by conducting a heat treatment as a lower temperature and in a shorter time than conventional processes has also been developed. More specifically, a metallic element that promotes crystallization is added as a catalyst element to an amorphous semiconductor film and then the semiconductor film is subjected to a heat treatment. Even according to this technique, to further improve the crystallinity, a method of obtaining a crystalline semiconductor film of even higher quality by further irradiating the crystalline semiconductor film, formed by the heat treatment, with a laser beam is often adopted such that the film is partially melted, solidified and recrystallized and has its crystal defects reduced.

However, it is known that according to such a method of crystallizing an amorphous semiconductor film or recrystallizing a crystalline semiconductor film by irradiating the film with a laser beam and melting and solidifying the film, the surface of the resultant crystalline semiconductor film will get uneven. Such surface unevenness is produced as follows. Specifically, after the crystalline semiconductor film has been once melted by being irradiated with a laser beam, crystal nuclei are created and the film is sequentially solidified from those nuclei. In the meantime, as those molten portions and solidified portions have mutually different expansivities, crystal grain boundary portions to get solidified last tend to be raised and form a sort of a range of mountains. Or at a triplet point or a multi-crystal intersection where three or more crystals intersect with each other, a mountainous protrusion is formed. Such a portion that is raised like a range of mountains or like a mountain on the surface of the crystalline semiconductor film will be referred to herein as a "ridge".

It is known that the ridge formed in this manner affects the characteristics of a TFT significantly. For example, since the top (or edge) of the ridge is sharp, the electric field is often concentrated there to generate leakage current, decrease the breakdown voltage of the gate insulating film, and eventually deteriorate the overall reliability of the device including hot carrier resistance. On top of that, if there is a ridge, the gate insulating film, deposited by a sputtering process or a CVD process, has decreased step coverage to make the electrical insulation insufficient. Furthermore, if the device is a top gate type thin-film transistor, the ridge will be located in the interface between the gate insulating film and the channel, and therefore, may sometimes affect the interface characteristic or decrease the field effect mobility. It is known that the field effect mobility of a TFT heavily depends on the degree of flatness of the interface between the TFT's active layer and the gate insulating film. That is to say, the flatter the interface, the higher the field effect mobility.

That is why various methods have been proposed to reduce those ridges (protrusions) on the surface of a crystalline semiconductor film that would affect the characteristics of a TFT.

For example, Patent Document No. 1 discloses a method of preventing those protrusions from being formed on the surface of a polycrystalline semiconductor film by depositing islands of an amorphous semiconductor material with a sloped edge and irradiating those islands with a laser beam within an oxidizing atmosphere. According to the method disclosed in Patent Document No. 1, a quality polycrystalline semiconductor film can be obtained. However, as the cooling rates are different between the edge portion and the body portion (i.e., the other portion) of the islands, crystallization advances from the edge of the islands of the amorphous semiconductor material, thus also forming a raised ridge on the edge. What is more, according to the method of Patent Document No. 1, the crystal grain size increases at the edge to make the grain sizes different between the edge and body portions. Or according to the method disclosed in Patent Document No. 5 (to be described later), the crystal grain size decreases at the edge to make the grain sizes different between the edge and body portions.

Each of Patent Documents No. 2, 3 and 4 discloses a method of reducing those ridges on the surface of a crystalline semiconductor film by performing the laser exposure process twice. More specifically, first, an amorphous semiconductor film is irradiated with a laser beam for the first time within an oxidizing atmosphere, thereby forming a polysilicon film. After that, in order to remove those ridges from the edges, the polysilicon film is irradiated with a laser beam for the second time within a vacuum or an inert gas.

Patent Document No. 1: Japanese Patent Application Laid-Open Publication No. 8-213637, Patent Document No. 2: Japanese Patent Application Laid-Open Publication No. 2001-60551, Patent Document No. 3: Japanese Patent Application Laid-Open Publication No. 2000-340503, Patent Document No. 4: Japanese Patent Application Laid-Open Publication No. 2003-142402, and Patent Document No. 5: Japanese Patent Application Laid-Open Publication No. 2000-101090

DISCLOSURE OF INVENTION

Problems to be Solved by the Invention

As described above, by irradiating a crystalline semiconductor film with a laser beam within a vacuum or an inert gas, the ridges can be reduced and a crystalline semiconductor film with a flattened surface can be obtained. However, the present inventors discovered and confirmed via experiments that in a TFT (a semiconductor device) fabricated with a crystalline semiconductor film obtained by the method disclosed in Patent Documents Nos. 1 to 4, the gate insulating film still had insufficient breakdown voltage and bad step coverage and leakage current was generated when the gate voltage was increased.

In order to overcome the problems described above, an object of the present invention is to provide a crystalline semiconductor film that can minimize the decrease in the breakdown voltage or step coverage of the gate insulating film and the deterioration in channel interface characteristic or the field effect mobility due to the generation of leakage current, for example, and also provide a method of making such a semiconductor film.

MEANS FOR SOLVING THE PROBLEMS

A crystalline semiconductor film according to the present invention includes islands of a crystalline semiconductor that are dispersed over a substrate. Each said island of the crystalline semiconductor has an upper surface and a sloped side surface, which are joined together with a curved surface. Crystal grains in a body portion of the island, including the upper surface, and crystal grains in an edge portion of the island, including the sloped side surface, both have average grain sizes that are greater than 0.2 μm.

In one preferred embodiment, the crystal grains in the body portion and the crystal grains in the edge portion both have average grain sizes falling within the range of 1 μm to 10 μm.

In another preferred embodiment, the average grain size of the crystal grains in the body portion is substantially equal to that of the crystal grains in the edge portion.

In still another preferred embodiment, the upper surface is substantially flat.

In this particular preferred embodiment, the upper surface has a centerline average roughness Ra of 5 nm or less.

A method of making a crystalline semiconductor film according to the present invention includes the steps of: (a) forming a first crystalline semiconductor film on a substrate; (b) patterning the first crystalline semiconductor film into a first island-like crystalline semiconductor film; and (c) melting and re-crystallizing the first island-like crystalline semiconductor film, thereby turning the first island-like crystalline semiconductor film into a second island-like crystalline semiconductor film.

In one preferred embodiment, the step (a) includes the steps of: (a1) forming an amorphous semiconductor film on the substrate; and (a2) crystallizing the amorphous semiconductor film to make the first crystalline semiconductor film.

In this particular preferred embodiment, the step (a2) includes irradiating the amorphous semiconductor film with a light ray.

In another preferred embodiment, the method further includes the step (a3) of adding a catalyst element that promotes crystallization to the amorphous semiconductor film between the steps (a1) and (a2).

In this particular preferred embodiment, the step (a2) includes thermally treating the amorphous semiconductor film.

In a specific preferred embodiment, the step (a3) includes adding at least one element selected from the group consisting of Ni, Co, Pd, Pt, Cu, Ag, Au, In, Sn, Al and Sb as the catalyst element.

More specifically, the step (a3) includes adding Ni as the catalyst element.

In another preferred embodiment, the step (a3) includes inducing crystal growth using a semiconductor compound of the catalyst element as crystal nuclei.

In this particular preferred embodiment, the amorphous semiconductor film is made essentially of silicon and the semiconductor compound of the catalyst element is a silicide.

In yet another preferred embodiment, the method further includes the step (d) of melting and re-crystallizing the first crystalline semiconductor film that has been formed in the step (a) before the step (b) is performed.

In yet another preferred embodiment, the step (c) includes irradiating the first island-like crystalline semiconductor film with a light ray.

In this particular preferred embodiment, the step (c) is performed substantially in a vacuum or in an atmosphere including an inert gas.

In a specific preferred embodiment, the inert gas is either a rare gas or nitrogen gas.

In yet another preferred embodiment, the step (d) includes irradiating the first crystalline semiconductor film that has been formed in the step (a) with a light ray.

In a specific preferred embodiment, the step (d) is performed in an atmosphere including oxygen.

In yet another preferred embodiment, the light ray is a laser beam.

A crystalline semiconductor film according to the present invention is made by one of the methods of making a crystalline semiconductor film described above.

A semiconductor device according to the present invention includes a crystalline semiconductor film according to any of the preferred embodiments described above.

A display device according to the present invention includes the semiconductor device described above.

EFFECTS OF THE INVENTION

According to the present invention, the islands of a crystalline semiconductor have a gently sloped shoulder portion (i.e., the junction between the body portion and the edge portion). Thus, by using a TFT including such a crystalline semiconductor film, a high-performance semiconductor device, in which the generation of leakage current is minimized and of which the gate insulating film has increased breakdown voltage and improved step coverage, is realized.

In addition, according to the present invention, both the crystal grains in the body portion and the crystal grains in the edge portion have average grain sizes that are greater than 0.2 μm, and preferably have substantially the same average grain size. That is to say, the overall crystalline semiconductor film preferably has a uniform grain size. That is why by using a TFT including such a crystalline semiconductor film, not only the effects described above but also uniform field effect mobility and constant TFT off-state current are achieved as well. As a result, a high-performance semiconductor device with low power dissipation is realized.

Furthermore, according to the present invention, an amorphous semiconductor film, to which a catalyst element that promotes crystallization has been added, is used, thereby obtaining a quality crystalline semiconductor film with aligned crystallographic orientations. And by fabricating a TFT with such a crystalline semiconductor film, a high-performance semiconductor device that exhibits stabilized characteristics can be obtained with variations in TFT characteristics reduced.

Consequently, by using the crystalline semiconductor film of the present invention, a high-performance semiconductor device is realized. Particularly when this semiconductor film is applied to an LCD, the switching characteristic of pixel switching TFTs can be improved as required in an active-matrix substrate and yet the performance of TFTs that form a peripheral driver circuit section can also be improved as well. As a result, in a driver monolithic active-matrix substrate including an active-matrix section and a peripheral driver circuit section on the same substrate, the size of the module can be reduced and the performance thereof can be improved.

The present invention is applicable for use in active-matrix-addressed LCDs, organic EL displays, close-contact image sensors and three-dimensional ICs, for example.

BRIEF DESCRIPTION OF DRAWINGS

FIG. 1(A) is a cross-sectional view schematically illustrating an island of a crystalline semiconductor according to the present invention, while FIG. 1(B) is a cross-sectional view schematically illustrating an island of a crystalline semiconductor obtained by the method disclosed in Patent Document No. 5.

Figure 1:
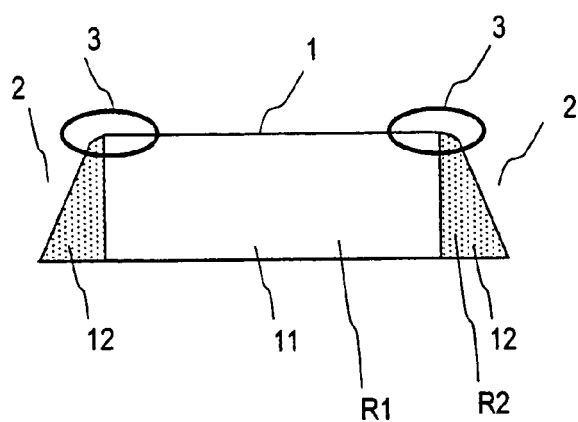
Figure 1:
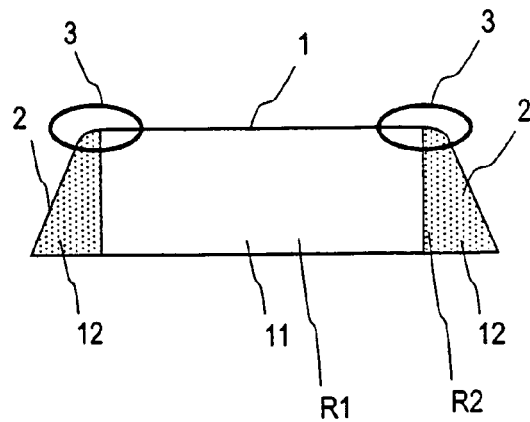

DESCRIPTION OF REFERENCE NUMERALS 1 upper surface
2 side surface
3 curved surface joining upper and side surfaces 2 together
11 body portion including upper surface
12 edge portion including side surface
91 underlying insulator
92 non-crystallized portion of amorphous semiconductor layer
93 crystalline semiconductor layer
94 semiconductor compound of catalyst element
101 substrate
102 first undercoat film
103 second undercoat film
104 amorphous silicon (a-Si) film
104a first crystalline semiconductor film (crystalline silicon film)
104b high-quality first crystalline semiconductor film (crystalline silicon film)
105 catalyst element (nickel)
106 laser beam
107 first island-like crystalline semiconductor film (island-like crystalline silicon film)
107a second island-like crystalline semiconductor film (island-like crystalline silicon film)
108 gate insulating film
109 gate electrode
110 n-type dopant (phosphorus)
111 portion masked with gate electrode and not implanted with phosphorus
112 regions not covered with gate electrode
116 insulating film
119 interlevel dielectric film
120 electrodes and interconnects of TFT
121 TFT

BEST MODE FOR CARRYING OUT THE INVENTION

To realize a TFT (a kind of semiconductor device) of which the gate insulating film has a high breakdown voltage and good step coverage by minimizing the generation of leakage current, the present inventors tried to find the reason why the desired TFT characteristics could not be achieved by the methods disclosed in Patent Documents Nos. 2 to 4 mentioned above. This is because as the surface of a crystalline semiconductor film formed by any of these methods has been flattened by reducing the ridges, the breakdown voltage of the gate insulating film should be improvable, theoretically speaking. As a result, the present inventors discovered that to realize a TFT with desired characteristics, it was not enough to just flatten the surface of the crystalline semiconductor film but it was also important to form islands of a crystalline semiconductor, of which the body and edge portions were joined together with a gently curved surface and which had a uniform crystal grain size over the entire crystalline semiconductor film.

This point will be described in further detail. As described above, if the islands of an amorphous semiconductor material are irradiated with a laser beam within an oxidizing atmosphere as in the method disclosed in Patent Document No. 1, raised ridges will be formed at the edges of the crystalline semiconductor film and the crystal grains at the edge will have significantly increased sizes. Once those ridges are formed, the breakdown voltage of the gate insulating film will decrease as described above. Also, if the crystal grains in the edge and body portions are different from each other and if the overall crystal film does not have a uniform grain size, then the field effect mobility and the off-state current will become non-uniform and other problems may also arise.

Besides, the characteristics of TFTs may change with their sizes. That is to say, the TFT characteristics will have increased transistor size dependence.

on the other hand, if the laser exposure process is performed twice as disclosed in Patent Documents Nos. 2 to 4 such that the crystalline semiconductor film with ridges at the edges, obtained by irradiating the amorphous semiconductor film with a laser beam for the first time within an oxidizing atmosphere, is irradiated with a laser beam again within a vacuum or an inert gas, the ridges can be reduced and a crystalline semiconductor film with a flattened surface can be obtained. According to the method described above, however, the crystalline semiconductor film is patterned after that, and therefore, the patterned islands of crystalline semiconductor have a trapezoidal cross section with a sharpened shoulder portion between the upper and side surfaces. For that reason, the electric field is easily concentrated in that shoulder portion, leakage current is generated there, and desired characteristics would not be achieved as a result.

In view of these considerations, the present inventors concluded that to realize a TFT with desired characteristics, the patterned islands of crystalline semiconductor preferably have such a gently curved shoulder portion and that the overall crystalline semiconductor film preferably has a uniform crystal grain size, thus acquiring the basic concept of the present invention.

A crystalline semiconductor film according to the present invention includes islands of a crystalline semiconductor that are dispersed over a substrate. Each island of the crystalline semiconductor of the present invention has an upper surface and a sloped side surface, which are joined together with a curved surface. Crystal grains in a body portion of the island, including the upper surface, and crystal grains in an edge portion of the island, including the sloped side surface, both have average grain sizes that are greater than 0.2 µm. Preferably, the average grain size of the crystal grains in the body portion is substantially equal to that of the crystal grains in the edge portion. By using a crystalline semiconductor film with such a configuration, the generation of leakage current can be minimized and a TFT, of which the gate insulating film has an increased breakdown voltage and improved step coverage, is realized.

Hereinafter, to further clarify the feature of a crystalline semiconductor film according to a preferred embodiment of the present invention, the islands of crystalline semiconductor of the present invention will be described in comparison with the counterparts formed by the method disclosed in Patent Document No. 5. An object of the subject matter of Patent Document No. 5 is to improve the output characteristic of drain current with respect to the gate voltage (i.e., the I-V characteristic). More specifically, according to Patent Document No. 5, in forming a polysilicon film by irradiating islands of amorphous silicon with a laser beam, if the average grain size of crystal grains in the edge (or peripheral) portion is substantially equal that of crystal grains in the body portion as in the prior art, carriers will be created even at a low gate voltage, and drain current will flow, in the peripheral portion. Based on this discovery, according to Patent Document No. 5, the intensity of the laser beam to irradiate the body portion is set higher than that of the laser beam to irradiate the edge portion, thereby varying the average grain sizes of the crystal grains in the edge and body portions intentionally.

FIG. 1(A) is a cross-sectional view schematically illustrating an island of a crystalline semiconductor according to a preferred embodiment of the present invention, while FIG. 1(B) is a cross-sectional view schematically illustrating an island of a crystalline semiconductor obtained by the method disclosed in Patent Document No. 5.

As shown in FIG. 1(A), the island of crystalline semiconductor of this preferred embodiment has an upper surface 1 and a sloped side surface 2, which are joined together with a curved surface 3. The average grain size R1 of crystal grains in a body portion 11, including the upper surface 1, and the average grain size R2 of crystal grains in an edge portion 12, including the sloped side surface 2, are both greater than 0.2 µm. Preferably, R1 and R2 are substantially equal to each other. In this case, the body portion 11 is a portion (or region) of the island of crystalline semiconductor including the upper surface 1 and means the remaining portion (region) of the island other than the sloped side surface 2. In FIG. 1(A), the upper surface 1 is illustrated as a flat surface for convenience sake. However, the upper surface 1 is not always flat.

On the other hand, the island of crystalline semiconductor disclosed in Patent Document No. 5 has an upper surface 1 and a sloped side surface 2 as shown in FIG. 1(B). The upper surface 1 and the sloped side surface 2 would also be joined together with a curved surface 3 and the island of Patent Document No. 5 and the counterpart of the present invention seem to have very similar shapes. However, unlike the present invention in which the average grain sizes R1 and R2 in the body and edge portions 11 and 12 are both greater than 0.2 µm and in which R1 and R2 are preferably substantially equal to each other, the average grain size R2 of crystal grains in the edge portion 12, including the sloped side surface 2, is 0.2 µm or less, which is smaller than the average grain size R1 of crystal grains in the body portion 11 including the upper surface 1 (where R1, R1≧0.3 µm).

Such a difference would probably arise from various differences between the manufacturing processes of these two structures.

As described above, according to Patent Document No. 5, a crystalline semiconductor film is formed by patterning an amorphous semiconductor film and then melting and re-crystallizing the resultant islands of amorphous semiconductor. If the islands of amorphous semiconductor are melted and re-crystallized in this manner, the body and edge portions have different temperature distributions, and therefore, often have mutually different average crystal grain sizes.

On the other hand, according to the present invention, a crystalline semiconductor film is formed before the patterning process unlike the process of Patent Document No. 5. That is why no difference in temperature distribution is sensed between the body and edge portions unlike Patent Document No. 5 and the overall crystalline semiconductor film would have a uniform grain size. According to the present invention, this crystalline semiconductor film is patterned after that. However, the patterned islands of crystalline semiconductor are controlled so as to maintain their original crystal grain shapes before the patterning process. Consequently, the average grain sizes of the body and edge portions substantially remain the same.

As described above, the upper surface 1 and the sloped side surface 2 are joined together with the curved surface 3 according to the present invention. This means that the island does not have a trapezoidal cross section with a steep shoulder portion (i.e., the junction between the upper surface and the sloped side surface), which is formed by etching and patterning a crystalline semiconductor film, for example, but has a gently curved cross section.

In this case, the upper surface is preferably substantially flat. According to the present invention, the breakdown voltage of the gate insulating film can be increased as long as the upper surface 1 and the sloped side surface 2 are joined together with the curved surface 3 at least, and the upper surface does have to be substantially flat. However, to realize even better characteristics, the upper surface is preferably substantially flat. As used herein, "being substantially flat" means that the centerline average roughness Ra has been reduced to 5 nm or less when measured with a probe type roughness meter compliant with the JIS B0601 standard.

Also, the "ridge" refers to a portion of a crystal grain boundary that has been raised like a range of mountains or a mountain on the surface of a crystalline semiconductor film as described above. Thus, as used herein, "having a reduced ridge" means that the upper surface is substantially flat (i.e., has an Ra of 5 nm or less).

Furthermore, when we say "the average grain size R1 of crystal grains in the body portion is substantially equal to the average grain size R2 of crystal grains in the edge portion", it means that the absolute value of the difference ΔR between R1 and R2 has been controlled to within the range of ±30% of R1.

In this preferred embodiment, the average grain sizes R1 and R2 of crystal grains in the body and edge portions 11 and 12 are both greater than 0.2 μm and preferably in the range of 1 μm to 10 μm. Such a large average grain size can be obtained by subjecting a first crystalline semiconductor, being formed by a solid-phase growth process, to a high-temperature annealing process for a long time. Alternatively, the average grain size of crystal grains can also be increased by adding a crystallization promoting catalyst element to the amorphous semiconductor film and by controlling the concentration of the catalyst element as low as possible (as will be described in detail later).

A method of making a crystalline semiconductor film according to the present invention includes the steps of: (a) forming a first crystalline semiconductor film on a substrate; (b) patterning the first crystalline semiconductor film into a first island-like crystalline semiconductor film; and (c) melting and re-crystallizing the first island-like crystalline semiconductor film, thereby turning the first island-like crystalline semiconductor film into a second island-like crystalline semiconductor film. The manufacturing process of the present invention is characterized in that after a first island-like crystalline semiconductor film has been formed in step (b) by patterning the first crystalline semiconductor that has been formed in step (a), the first island-like crystalline semiconductor film is melted and re-crystallized, thereby forming a second island-like crystalline semiconductor film in step (c). Comparing the manufacturing process of the present invention to the methods disclosed in Patent Documents Nos. 2, 3 and 4 mentioned above, it can be seen that unlike the process of the present invention, the first crystalline semiconductor is melted and re-crystallized directly (i.e., without being patterned) by being exposed to a laser beam and then patterned in each of these patent documents cited. As a result, according to the methods disclosed in those patent documents, the islands of crystalline semiconductor with the features of the present invention described above cannot be formed, leakage current is generated, and the breakdown voltage of the gate insulating film decreases. In contrast, according to the manufacturing process of the present invention, the islands of crystalline semiconductor with the features described above can be formed, no leakage current is generated, and therefore, a semiconductor device including a gate insulating film with an increase breakdown voltage can be obtained (see specific examples of the present invention to be described later).

Hereinafter, the respective process steps will be described in further detail.

The step (a) includes the steps of (a1) forming an amorphous semiconductor film on the substrate and (a2) crystallizing the amorphous semiconductor film to make the first crystalline semiconductor film.

In this case, the step (a2) may be performed either by irradiating the amorphous semiconductor film with a light ray to melt and re-crystallize the film or by crystal-growing the amorphous semiconductor film by thermally treating the film at around 600° C. without heating it up to its melting point (i.e., by a solid-phase growth process).

According to the former method of irradiating the amorphous semiconductor film with a light ray, the amorphous semiconductor film can be melted and re-crystallized instantaneously. In this case, the amorphous semiconductor film is preferably irradiated with a laser beam such as excimer laser beam. The crystalline semiconductor thus obtained has its crystal defects reduced by going through the melting and solidifying process step using the laser beam, and therefore, has even higher quality. The laser beam is preferably a pulsed laser beam, which is preferably targeted on an arbitrary point on the amorphous semiconductor film a number of times continuously. Then, a crystalline semiconductor with good crystallinity can be obtained without doing any thermal damage on the substrate.

The latter solid-phase growth process is beneficial because re-crystallization is easily realized by conducting a heat treatment at a low temperature, for example. This method is preferably adopted if the first crystalline semiconductor is produced by adding a crystallization promoting catalyst element (the step (a3)) to the amorphous semiconductor film obtained by performing the step (a1).

If the catalyst element is added to the amorphous semiconductor film, the method preferably further includes the step (d) of melting and re-crystallizing the first crystalline semiconductor before the step (b) of patterning the first crystalline semiconductor is performed. Then, the first crystalline semiconductor is re-crystallized and comes to have an even higher degree of crystallinity.

The step (d) is preferably performed by irradiating the first crystalline semiconductor with a light ray such as excimer laser beam. More specifically, a pulsed laser beam is preferably used as the laser beam and focused on an arbitrary point on the amorphous semiconductor film a number of times consecutively. The step (d) of radiating the laser beam is preferably carried out within an atmosphere including oxygen. As a result, a ridge is formed on the surface of the first crystalline semiconductor but good crystallinity is realized. Specific conditions change with the film qualities and thicknesses of the silicon and its underlying insulating film. For example, the energy density of the light ray is preferably controlled to the range of approximately 300 to 500 mJ/cm$^2$, for example.

By melting and re-crystallizing the crystalline semiconductor that has already been crystallized by going through the heat treatment using the crystallization promoting catalyst element, the resultant crystalline semiconductor not only achieves the effect described above but also has further aligned crystallographic orientations. In that case, compared to the method of crystallizing the amorphous semiconductor film by directly melting and re-crystallizing it, much higher current drivability, represented by the field effect mobility of TFTs that has been more than doubled, is realized. According to this method, however, the metallic element used as the catalyst element might affect the semiconductor. That is why when such a manufacturing process is adopted, after the crystal growth process, the catalyst element is preferably removed (or displaced) from the channel region and from the vicinity of the junctions between the channel region and the source/drain regions. The catalyst element described above tends to be concentrated around a region where there is either an element belonging to Group Vb and giving n-type conductivity (such as phosphorus) or an element belonging to Group IIIb and giving p-type conductivity (such as boron). Thus, a technique of creating a region to which those elements have been introduced and moving the catalyst element to that region is adopted.

Next, the first crystalline semiconductor, produced by performing the step (a), is patterned, thereby forming a first island-like crystalline semiconductor film. The patterning process may be a normal plasma etching process, an inductively coupled plasma (ICP) etching process, a reactive ion etching (RIE) process, or a chemical dry etching (CDE) process. As the etching gas, a fluorocarbon gas such as $CF_4$ or $SF_6$ gas or a mixture of such a fluorocarbon gas and oxygen may be used. Among these etching processes, the ICP etching process and the RIE process are particularly preferred. By adopting any of these processes, a crystalline silicon film, of which the side surface has various taper angles, can be formed with high precision. The taper angles are controllable by changing the types of the etching gases and the mixture ratios thereof.

In the first island-like crystalline semiconductor film that has been obtained as a result of the patterning process, each island has a trapezoidal cross section with an upper surface (top surface) and a sloped side surface. And the shoulder portion, which is the junction between the upper and side surfaces, is not curved gently but a sharp edge. The average grain size of crystal grains in the portion including the upper surface is substantially equal to that of crystal grains in the edge portion including the sloped side surface. Furthermore, if the step (d) has been performed before the patterning process, a ridge has been formed on the upper surface.

Next, the first island-like crystalline semiconductor film, obtained by performing the step (b), is melted and re-crystallized, thereby forming a second island-like crystalline semiconductor film in step (c). In the second island-like crystalline semiconductor film obtained as a result of the step (c), the ridge that was present on the surface of the first island-like crystalline semiconductor film needs to have been rounded, the body and edge portions need to be joined together with a gently curved surface, and the average grain size of crystal grains in the first island-like crystalline semiconductor film needs to be maintained (i.e., the average grain sizes of the upper surface and edge portions need to have hardly changed and almost remain the same). In this process step (c), any process may be adopted to melt and re-crystallize the first island-like crystalline semiconductor film as long as the desired second island-like crystalline semiconductor film can be obtained. For example, a light ray radiating process, a rapid thermal annealing (RTA) process that uses a normal resistance-heating heat treatment furnace or lamp, or an RTA process that blows a high-temperature gas may be adopted. If an RTA system that raises or lowers the temperature rapidly by blowing a high-temperature inert gas onto the surface of the substrate is adopted, the temperature is preferably maintained within an appropriate range of about 550° C. to about 750° C. for approximately 30 seconds to 10 minutes. The temperature increase and decrease rates are both preferably equal to or higher than 100° C./min. Among these melting and re-crystallizing processes, the light ray radiating process is preferably adopted.

If the first island-like crystalline semiconductor film is irradiated with a light ray in the process step (c), this process step is preferably carried out substantially within a vacuum or an inert gas (such as a rare gas or nitrogen gas). Then, a second island-like crystalline semiconductor film, of which the body and edge portions are joined together with a gently curved surface, can be obtained. This atmosphere is preferably "substantially" a vacuum or an inert gas, which means that the atmosphere may contain a very small amount of oxygen. To realize the desired characteristics, the shoulder portion of the second island-like crystalline semiconductor film needs to be at least gently curved as described above. However, even if a very small amount of oxygen is contained, the desired gently curved shape will still be formed. The permissible concentration of oxygen changes with the film qualities or thicknesses of the silicon and its underlying insulating film or the manufacturing conditions of the first island-like crystalline semiconductor film but is preferably approximately 1% or less. It should be noted that the first island-like crystalline semiconductor film is most preferably irradiated with a light ray within an oxygen-free vacuum or inert gas because the second island-like crystalline semiconductor film will have not only such a gently curved shape but also a further rounded ridge on the surface.

Examples of rare gases that are preferably used in this preferred embodiment include He (helium), Ne (neon), Ar (argon), Kr (krypton), Xe (xenon) and Rd (radon). Among other things, a vacuum and a nitrogen gas atmosphere are particularly preferred.

Also, to form the desired second island-like crystalline semiconductor film without changing the average grain size of crystal grains in the first island-like crystalline semiconductor film, the energy density of the light ray is preferably controlled appropriately. Specific conditions change with the film qualities or thicknesses of the silicon and its underlying insulating film. But the energy density of the light ray is preferably controlled to the range of about 300 mJ/cm$^2$ to about 500 mJ/cm$^2$.

If the process steps (a2) and (d) are both performed using a light ray, the energy density of the light ray used in the step (d) is preferably defined so as to fall within substantially the same energy density range of the light ray used in the step (c). As described above, in the process steps (d) and (c), light rays with the best energy densities are radiated to form first and second island-like crystalline semiconductor films, respectively, just as intended. In both of these process steps, the film qualities and thicknesses of the silicon and its underlying insulating film hardly change. That is why the energy densities are defined within substantially the same range in these process steps. More specifically, the energy densities of the light rays are preferably controlled within the range of about 300 to about 500 mJ/cm$^2$ in both of the process steps (d) and (c) and the energy density of the light ray used in the process step (d) preferably has a difference of at most ±100 from that of the light ray used in the process step (c).

Figure 2:
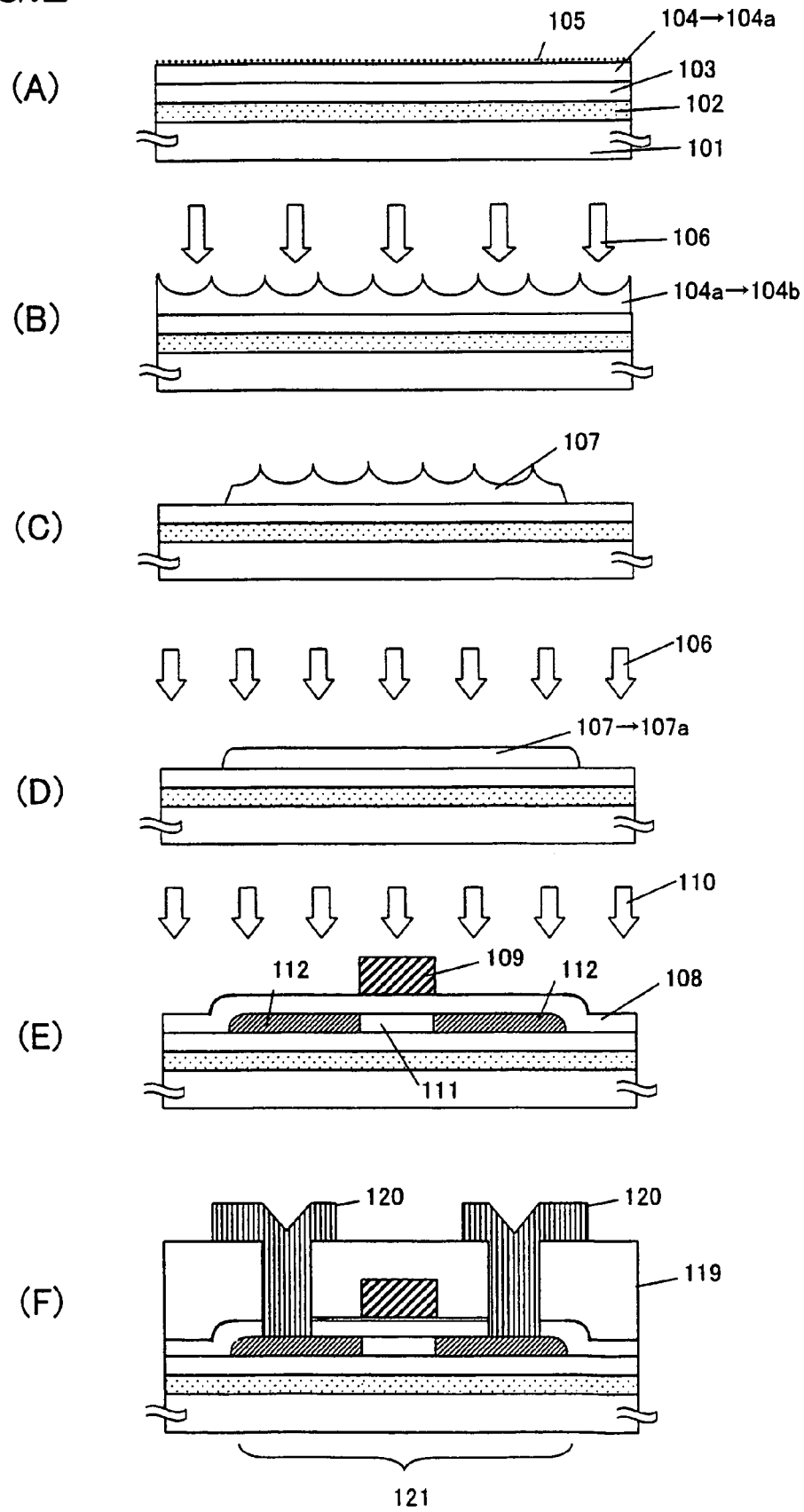
FIGS. 2(A) through 2(F) are schematic cross-sectional views showing a manufacturing process of a semiconductor device according to a preferred embodiment of the present invention.

Hereinafter, a preferred embodiment of a method of making a crystalline semiconductor film of silicon, which is a typical semiconductor, and a preferred embodiment of a method for fabricating a semiconductor device will be described with reference to FIG. 2. It should be noted, however, that the manufacturing process of the present invention does not have to be applied to a silicon film but could also be applied to a germanium film or a silicon-germanium composite film, too. Also, in this preferred embodiment, a desired crystalline semiconductor is produced by adding a catalyst element to an amorphous semiconductor film. However, the present invention is in no way limited to that specific preferred embodiment. A desired crystalline semiconductor can also be produced even without using the catalyst element.

The following preferred embodiment is a method for fabricating an n-channel TFT on a glass substrate. The TFT of this preferred embodiment can be used not just in the driver circuit and pixel portion of an active-matrix-addressed LCD or an organic EL display but also as an element to form a thin-film integrated circuit. FIG. 2 illustrates cross-sectional views showing the manufacturing process of an n-channel TFT, which proceeds in the order of (A) through (G), or in the alphabetical order.

First, as shown in FIG. 2(A), an amorphous silicon (a-Si) film 104 is formed over a substrate 101 (corresponding to the step (a1)). In this preferred embodiment, before the amorphous silicon film 104 is formed over the substrate 101, a first undercoat film 102 of silicon oxynitride and a second undercoat film 103 of silicon dioxide are formed thereon, thereby preventing impurities in the substrate 101 from diffusing and entering the amorphous silicon film 104.

The substrate 101 supports not only the amorphous silicon film 104 but also a crystalline silicon film to be made from the amorphous silicon film 104 and a semiconductor device to be made of the crystalline silicon film. The substrate 101 is preferably substantially non-deformable even at the highest temperature of various semiconductor device manufacturing process steps, including a heat treatment to be conducted on the amorphous silicon film 104. Also, so as not to affect the electrical characteristics of a semiconductor device to be made of the crystalline silicon film, the surface of the substrate 101 to deposit the amorphous silicon film 104 thereon is preferably electrically insulating and does not react with the amorphous silicon film 104 even at the elevated temperatures during the semiconductor device manufacturing process. Or the impurities included in the substrate 101 preferably never diffuse from the substrate 101 toward the amorphous silicon film 104, either.

The material of the substrate 101 is not particularly limited and the substrate may be made of glass, quartz or any other suitable material. As will be described later, according to the present invention, crystallization is realized by performing a low-temperature heat treatment for just a short time. That is why an inexpensive glass substrate may be used instead of an expensive quartz substrate having high thermal resistance and showing almost no shrinkage under the heat.

In this preferred embodiment, a low-alkali glass substrate was used. In this case, the substrate may be thermally treated in advance at a temperature that is lower than the glass strain point by about 10 to 20° C. The surface of this substrate 101 to fabricate a TFT thereon is covered with an undercoat film of silicon dioxide, silicon nitride or silicon oxynitride, for example, to prevent impurities from diffusing from the substrate 101. In this preferred embodiment, a silicon oxynitride film was deposited as a first undercoat film 102 by a plasma CVD process using source gases of $SiH_4$, $NH_3$ and $N_2O$ and then a second undercoat film 103 was stacked thereon by a plasma CVD process again using source gases of $SiH_4$ and $N_2O$. In this case, the first undercoat film 102 of silicon oxynitride had a thickness of 25 nm to 200 nm, e.g., 100 nm, and the second undercoat film 103 of silicon dioxide has a thickness of 25 nm to 300 nm, e.g., 100 nm. Although a two-layer undercoat film is used in this preferred embodiment, a single layer of silicon dioxide may also be used.

The amorphous silicon film 104 is formed by a plasma CVD process, a sputtering process or any other suitable process. Among other things, a plasma CVD process is preferred because an amorphous silicon film can be deposited quickly at a low temperature. More specifically, the plasma CVD process is preferably carried out using a mixture of $SiH_4$ and $H_2$ gases. The dimensions and thickness of the amorphous silicon film 104 may be appropriately determined according to the structure and dimensions of a semiconductor device to fabricate. In fabricating a TFT, the amorphous silicon film 104 may have a thickness of 30 nm to 100 nm, for example. In this preferred embodiment, an amorphous silicon film was deposited to a thickness of 50 nm by a plasma CVD process. Optionally, the undercoat films 102, 103 and the amorphous silicon film 104 may be deposited continuously by the same type of process. In that case, the undercoat films deposited are not exposed to the air once and it is possible to prevent their surfaces from being contaminated. As a result, the variations in the characteristics or threshold voltage of the TFTs to fabricate can be reduced.

Subsequently, a catalyst element 105 that promotes crystallization is added to the a-Si film 104 (corresponding to the step (a3)). In this preferred embodiment, nickel was used as the catalyst element 105 and the a-Si film 104 was spin-coated with an aqueous solution including 10 ppm of nickel by weight (e.g., a nickel acetate aqueous solution), thereby forming a layer containing a catalyst element 105.

As the catalyst element, one or more elements selected from the group consisting of nickel (Ni), cobalt (Co), palladium (Pd), platinum (Pt), copper (Cu), silver (Ag), gold (Au), indium (In), tin (Sn), aluminum (Al) and antimony (Sb) is preferably used. The element(s) selected from this group would promote crystallization even when added in a very small amount. Among other things, the most significant effects are achieved when Ni is used. However, the catalyst element 105 never functions by itself but contributes to crystal growth when bonded to the amorphous silicon film 104 and turned into a silicide. The crystal structure of that silicide functions as a sort of a mold for, and promotes, the crystallization of the amorphous silicon film 104. Ni and two Si form $NiSi_2$, which has a fluorite type crystal structure that is very similar to the diamond structure of single crystal silicon. Besides, $NiSi_2$ has a lattice constant of 5.406 Å (=0.5406 nm), which is very close to that of the diamond structure of crystalline silicon of 5.430 Å (=0.5430 nm). That is why $NiSi_2$ is the best mold for crystallizing the amorphous silicon film 104, and therefore, it is most preferable to use Ni as the catalyst element 105 of the present invention.

Examples of methods of introducing the catalyst element 105 include a sputtering process, an evaporation process, a plating process, an ion doping process, a CVD process, and a spin coating process. In the spin coating process, a solution or a dispersion of the catalyst element 105 is applied onto the substrate and then dried. By controlling the concentration of the catalyst element in the solution or the dispersion, the amount of the catalyst element 105 to be introduced into the amorphous silicon film 104 can be adjusted.

The concentration of the catalyst element 105 in the amorphous silicon film 104 is preferably about $1\times10^{16}$ atoms/cm$^3$ to about $1\times10^{18}$ atoms/cm$^3$. The reasons are as follows. Specifically, if the concentration of the catalyst element 105 were less than $1\times10^{16}$ atoms/cm$^3$, then the crystal growth would be promoted so insufficiently as to leave a lot of amorphous regions. On the other hand, if the concentration of the catalyst element 105 exceeded about $1\times10^{18}$ atoms/cm$^3$, then the catalyst element might cause leakage current when the channel region of the semiconductor device is formed.

As long as it is before the process step of creating crystal nuclei to be described later, the process step of introducing the catalyst element 105 into the amorphous silicon film 104 may be performed either before or after the amorphous silicon film 104 is deposited on the substrate 101. Normally, before the amorphous silicon film 104 is deposited on the substrate 101, the undercoat film 103 of silicon dioxide is formed on the substrate 101 to prevent impurities in the substrate 101 from diffusing toward the amorphous silicon film 104 as described above for this preferred embodiment. The surface of the amorphous silicon film 104 is hydrophobic, whereas that of the undercoat film 103 is hydrophilic. That is why if the spin coating process is carried out using a hydrophilic solvent, the solution can be applied onto the undercoat film 103 with more stability rather than onto the amorphous silicon film 104. If the catalyst element 105 has been introduced onto either the substrate 101 or the undercoat film 103, then the crystal growth will start from the bottom of the amorphous silicon film 104.

A solution including the catalyst element 105 is applied onto either the substrate or the amorphous silicon film by a spin coating process so as to have a surface concentration of $1 \times 10^{12}$ atoms/cm$^2$ to $1 \times 10^{14}$ atoms/cm$^2$ and then dried. A surface concentration in this range is preferred for the following reasons. Specifically, if the surface concentration were less than $1 \times 10^{12}$ atoms/cm$^2$, the crystal growth would be promoted so insufficiently as to leave a lot of amorphous regions. On the other hand, if the surface concentration exceeded $1 \times 10^{14}$ atoms/cm$^2$, then leakage current will be generated. The surface concentration of the catalyst element 105 may be measured by a total reflection X-ray fluorescence (TRXRF) analysis, for example.

The solution including the catalyst element 105 such as nickel preferably includes at least one solvent selected from the group consisting of water, methanol, ethanol, n-propanol, i-propanol and acetone. If nickel is used as the catalyst element 105, nickel can be applied uniformly onto the substrate 101 or the amorphous silicon film 104 by dissolving nickel acetate in the solvent(s).

Alternatively, the catalyst element 105 such as nickel can also be introduced even by performing a DC (direct current) sputtering process at a low voltage. In this case, by setting the DC voltage low, the catalyst element 105 can be introduced at a very low concentration. The DC voltage may be about 200 V to about 600 V, for example.

The catalyst element 105 that has been applied onto either the substrate 101 or the amorphous silicon film 104 is introduced into the amorphous silicon film 104 by being heated in the process step of creating crystal nuclei to be described below.

Next, a heat treatment is carried out within an inert atmosphere such as a nitrogen atmosphere (corresponding to the step (a2)). As this heat treatment, an annealing process is preferably performed at a temperature of 550° C. to 600° C. for 30 minutes to 4 hours. In this preferred embodiment, the heat treatment was conducted at 580° C. for an hour within a nitrogen atmosphere. During this heat treatment, the nickel atoms 105 that have been added onto the surface of the a-Si film 104 diffuse and enter the a-Si film 104 and are also turned into a silicide, which functions as a nucleus for crystallizing the a-Si film 104. As a result, the a-Si film 104 is crystallized to be a first crystalline silicon film 104a. In this example, the amorphous silicon film 104 is crystallized by being subjected to a heat treatment using a furnace. Alternatively, the amorphous silicon film 104 may also be crystallized with an RTA system that may use a lamp as a heat source.

Next, as shown in FIG. 2(B), the first crystalline silicon film 104a, obtained as a result of the heat treatment process, is irradiated with a laser beam 106 within an oxidizing atmosphere (corresponding to the first laser radiation step (d)). As a result, the first crystalline silicon film 104a has its crystal defects further reduced and is re-crystallized, thus forming a high quality first crystalline silicon film 104b with a higher degree of crystallinity. In this process step, the laser beam may be an XeCl excimer laser beam (with a wavelength of 308 nm and a pulse width of 40 nsec) or a KrF excimer laser beam (with a wavelength of 248 nm). In this case, the laser beam has been shaped so as to form an elliptical beam spot on the surface of the substrate 101. And by sequentially scanning the surface of the substrate perpendicularly to the major-axis direction of the elliptical beam spot, the entire surface of the substrate is re-crystallized. Also, if the surface is scanned with the laser beam such that the beam spots partially overlap with each other, an arbitrary point on the first crystalline silicon film 104a is irradiated with the laser beam a number of times and the degree of uniformity can be increased. In this process step, the energy density of the laser beam should not be too low to achieve good crystallinity or too high to avoid variations in crystallinity, and therefore, needs to be defined to fall within an appropriate range. In this preferred embodiment, the laser beam is radiated at an energy density of 350 mJ/cm$^2$ to 500 mJ/cm$^2$ (e.g., 420 mJ/cm$^2$) and an arbitrary point is irradiated with 10 to 40 shots (e.g., 20 shots) of a laser beam, thereby forming a first crystalline silicon film 104b having crystal grain sizes of 2 μm to 5 μm and an average grain size of about 3 μm. On the surface of the first crystalline silicon film 104b obtained as a result of this process step, there are ridges as shown in FIG. 2(B).

Thereafter, as shown in FIG. 2(C), the first crystalline silicon film 104b is patterned (e.g., etched), thereby forming a first island-like crystalline silicon film 107 (corresponding to the step (b)). In this preferred embodiment, an RIE process is carried out using CHF$_3$ gas as an etching gas. As a result of this process step, a semiconductor layer to be the active regions of TFTs (including source/drain regions and a channel region) is formed. Each island of the island-like crystalline silicon film 107 patterned has a trapezoidal cross section. More specifically, the island has an upper surface (top surface) with a ridge and a sloped side surface, and the junction between the upper and side surfaces has a steep and sharp edge, which is not gently curved, as shown in FIG. 2(C).

Next, as shown in FIG. 2(D), the first island-like crystalline silicon film (semiconductor layer) 107 thus obtained is irradiated with a laser beam 106 substantially within a vacuum or a inert atmosphere (corresponding to the second laser radiation process step (c)). In this process step, the laser beam 106 is radiated such that the crystal grains in the first island-like crystalline silicon film 107 will maintain the same grain sizes, and the surface is smoothed out with the ridges reduced, even after the second laser radiation process step. More specifically, the radiation energy density of the second laser radiation process step is preferably controlled so as to fall within the same range as the first laser radiation process step and have a difference of at most ±100 mJ/cm$^2$ with respect to the laser beam energy density of the first laser radiation process step. In this preferred embodiment, as in the first laser radiation process step, an XeCl excimer laser beam (with a wavelength of 308 nm and a pulse width of 40 nsec) or a KrF excimer laser beam (with a wavelength of 248 nm) is radiated within a nitrogen gas atmosphere, for example, at a radiation energy density of 350 mJ/cm$^2$ to 500 mJ/cm$^2$ (e.g., 420 mJ/cm$^2$) and with an arbitrary point irradiated with 10 to 40 shots (e.g., 20 shots) of laser beams, thereby obtaining a second island-like crystalline silicon film 107a having crystal grain sizes of about 2 μm to about 5 μm and an average grain size of about 3 μm.

In the second island-like crystalline silicon film 107a thus obtained (that will make either an active region or at least the channel region of the active region), the crystallographic plane orientations of its crystals are mostly those of a <111> zone. More specifically, among the crystallographic plane orientations of the crystalline semiconductor film belonging to the <111> zone, 50% or more of the entire film have (110) and (211) plane orientations. In general, if crystallization is produced without using a catalyst element, the resultant crystalline semiconductor film is affected by an insulator (such as amorphous silicon dioxide, in particular) that is located under the semiconductor film and tends to have a (111) crystallographic plane orientation. On the other hand, FIG. 4(A) schematically illustrates how most of the crystallographic plane orientations of the crystalline semiconductor film, formed by crystallizing an amorphous semiconductor film with a catalyst element added thereto, belong to the <111> zone. In FIG. 4(A), the reference numeral 91 denotes the underlying insulator, 92 denotes a non-crystallized portion of the amorphous semiconductor layer, 93 denotes a crystalline semiconductor film, and 94 denotes a semiconductor compound of a catalyst element, which is the driving force of the crystal growth.

As shown in FIG. 4(A), the semiconductor compound 284 of the catalyst element is present on the front line of the crystal growth and is going to crystallize its adjacent amorphous region 92 sequentially to the right on the paper. In the meantime, the semiconductor compound 94 of the catalyst element tends to grow more rapidly in the direction of the <111> planes. As a result, the <111> zone appears to include the crystallographic plane orientations of the crystalline semiconductor film as shown in FIG. 4(A).

FIG. 4(B) shows the <111> zone. In FIG. 4(B), the abscissa represents the tilt angle from a (−100) plane and the ordinate represents the surface energy. The group 95 is a group of crystal planes that form the <111> zone. (100) and (111) planes actually do not belong to the <111> zone but are shown for the purpose of comparison.

FIG. 4(C) shows a standard triangle of crystallographic plane orientations, in which the <111> zone is distributed as indicated by the dashed line and the numerals denote the indices of representative poles. Among the planes belonging to this <111> zone, (110) and (211) planes prevail in the crystalline semiconductor film of the present invention. And if these two planes account for 50% or more of all crystallographic planes, the prevalence is achieved. These two crystallographic planes have much a higher hole mobility than the other planes and therefore contribute to improving the performance of p-channel TFTs, which is usually inferior to that of n-channel TFTs. As a result, a proper balance can be easily struck even in a CMOS circuit.

Figure 4:
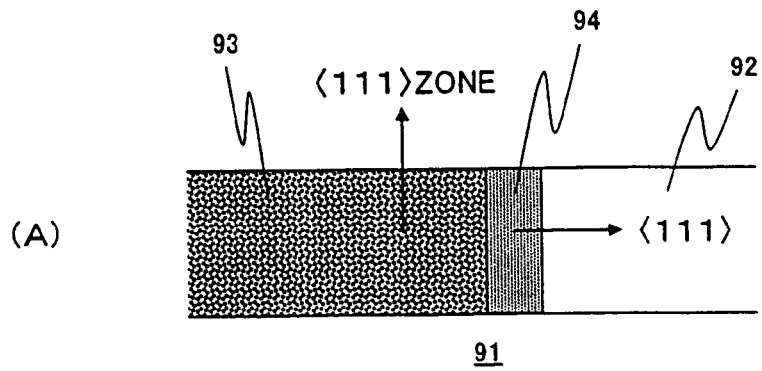
FIGS. 4(A), 4(B) and 4(C) respectively show the direction of crystal growth, a <111> zone, and a standard triangle of crystallographic plane orientations in a situation where an amorphous semiconductor film is crystallized with a catalyst element added thereto.
Figure 4:
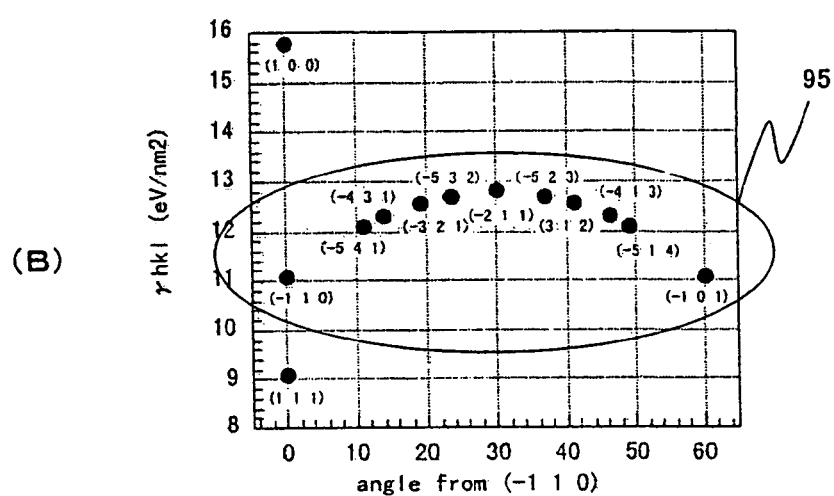
Figure 4:
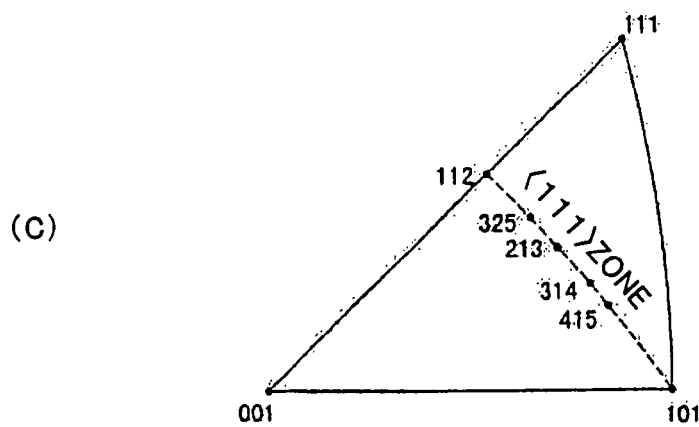
Figure 5:
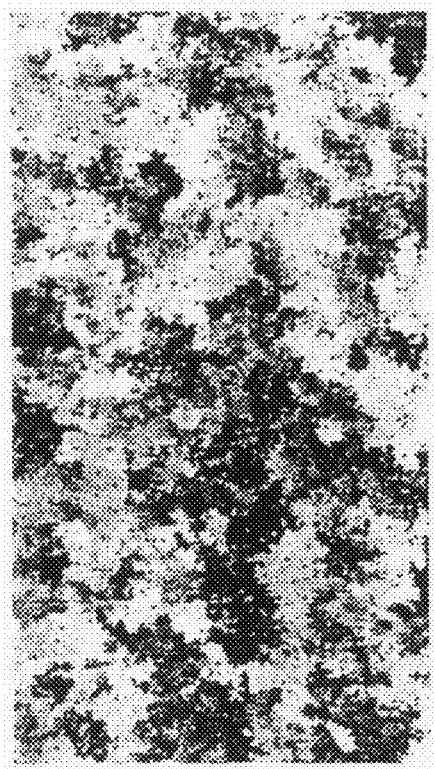
FIGS. 5(A) and 5(B) show the distributions of plane orientations in crystalline semiconductor films that were obtained with a catalyst element added and FIG. 5(C) shows a standard triangle of crystallographic plane orientations.
Figure 5:
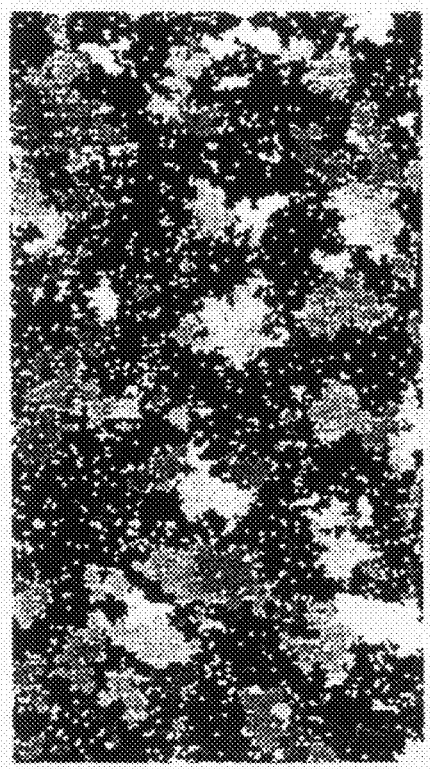
Figure 5:
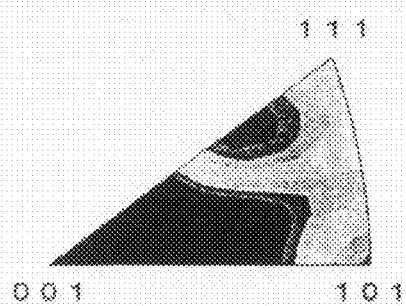
Figure 5:
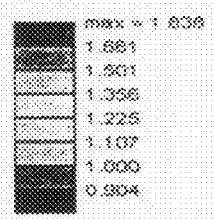

An exemplary distribution of crystallographic plane orientations in the crystalline semiconductor film of this preferred embodiment is shown in FIG. 4, which shows results that were obtained by combining electron backscattering patterns (EBSP) together. More specifically, the crystallographic plane orientations of respective subdivided regions were determined and then combined and mapped together. FIG. 5(A) shows the distribution of plane orientations in the crystalline semiconductor film of the present invention. FIG. 5(B) shows a contrasted distribution of respective crystal grains (where each "crystal grain" herein means a region with substantially the same plane orientation) by painting adjacent mapping points, of which the plane orientation inclinations are equal to or smaller than a predetermined value (e.g., 5 degrees or less in this example), in the same color based on the data shown in FIG. 5(A). And FIG. 5(C) shows the standard triangle of the crystallographic plane orientations that has already been described with reference to FIG. 4(C).

As can be seen from FIG. 5(C), the crystalline silicon film of this preferred embodiment has crystallographic plane orientations, most of which are roughly distributed on the <111> zone and in which (110) and (211) planes are particularly prevalent. Also, in the crystalline semiconductor film of this preferred embodiment, when the crystallographic plane orientations on the surface of the crystalline semiconductor were detected by the EBSP analysis, the crystalline semiconductor film turned out to consist of crystal grains, each of which was made up of crystals with an orientation difference of less than 10 degrees. In this preferred embodiment, the average grain size of crystal grains was figured out by calculating the diameters of circles having the same areas as respective crystal regions with crystallographic plane orientations of less than 10 degrees within a vision of interest (with dimensions of 51 μm by 102 μm) using an image processor and then calculating the average of those diameters.

In this preferred embodiment, the laser radiation process steps are performed twice as described above. However, even after the laser radiation process step has been carried out for the second time, the original crystallographic plane orientations and the crystal grain conditions are maintained as they as and show no significant changes in the EBSP analysis compared to the crystal grains yet to be irradiated with the laser beam.

Next, the crystalline silicon film 107a thus obtained is subjected to known semiconductor device processing, thereby fabricating various semiconductor devices. Optionally, resistors and capacitors may be formed either simultaneously with, or after, the fabrication of the semiconductor devices to form various types of drivers, memories or logic circuits.

Hereinafter, a method for fabricating an n-channel TFT on a glass substrate will be described as an example.

First, a gate insulating film 108 is deposited over the second island-like crystalline silicon film 107a. According to this preferred embodiment, the shoulder portion of the second island-like crystalline silicon film 107a is gently curved. That is why the gate insulating film 108 also has a gently curved shoulder portion as shown in FIG. 2(E). The gate insulating film 108 is preferably made of silicon dioxide with a thickness of 20 nm to 150 nm (e.g., 100 nm in this example). More specifically, the silicon dioxide film was formed by using tetraethoxyorthosilicate (TEOS) as a source material and decomposing and depositing the material with oxygen by an RF plasma CVD process in which the substrate was heated to a temperature of 150° C. to 600° C. (preferably 300° C. to 450° C.). Alternatively, the silicon dioxide film may also be formed by using TEOS as a source material and decomposing and depositing the material with ozone gas by either a low pressure CVD process or an atmospheric pressure CVD process in which the substrate was heated to a temperature of 350° C. to 600° C. (preferably 400° C. to 550° C.). Optionally, the gate insulating film thus deposited may be annealed at a temperature of 500° C. to 600° C. for one to four hours within an inert atmosphere to improve the bulk property of the gate insulating film itself or the interfacial property between the crystalline silicon film and the gate insulating film.

Alternatively, an SiN film may be deposited as the gate insulating film 108 and an organic insulating film of an acrylic material, for example, may be deposited as an upper-level insulating film 116 by a spin-coating process. Then, the insulating film 116 has good step coverage, thus achieving the same effects as those described above.

Thereafter, a conductive film is deposited on the gate insulating film 108 by a sputtering process or a CVD process, for example, and then patterned into a gate electrode 109. In this process step, the conductive film may be any of various metallic films or a semiconductor film heavily doped with a donor or acceptor element. In this preferred embodiment, to conduct a heat treatment when the source/drain regions are activated later, the conductive film was made of a refractory metal with a high melting point such as an element selected from the group consisting of tantalum (Ta), tungsten (W), molybdenum (Mo) and titanium (Ti), an alloy consisting essentially of at least one of these elements, or an alloy including at least two of these elements in combination (such as an Mo-W alloy or an Mo-Ta alloy). A low-melting metal such as aluminum (Al) may also be used. In that case, activation by laser radiation may be combined and the thickness of a film of such a material is preferably 300 nm to 600 nm. In this preferred embodiment, tungsten (W) including a very small amount of nitrogen as an additive was used and the thickness was 300 nm to 600 nm, e.g., 450 nm. Also, in that case, the concentration of the impurities contained had better be reduced to decrease the resistance. By reducing the oxygen concentration to 30 ppm or less, a resistivity of 20 μΩcm or less was realized. Then, by patterning the conductive film by photolithographic and etching processes, the gate electrode 109 can be formed. In this preferred embodiment, an RIE process was performed as the etching process to form a gate electrode 109, of which the side surfaces had a tilt angle of 75 to 85 degrees.

Next, as shown in FIG. 2(E), using the gate electrode 109 as a mask, the second island-like crystalline silicon film 107a is heavily doped with an n-type dopant (such as phosphorus) 110 by an ion doping process. By performing this process step, portions 112 of the second island-like crystalline silicon film 107a that are not covered with the gate electrode 109 are heavily implanted with phosphorus ions 110. In this preferred embodiment, phosphine ($PH_3$) was used as a doping gas, the acceleration voltage was 40 kV to 90 kV (e.g., 60 kV) and the implant dose was $1 \times 10^{12}$ cm$^{-2}$ to $1 \times 10^{16}$ cm$^{-2}$ (e.g., $1 \times 10^{15}$ cm$^{-2}$). As a result of this process step, the region 111 that is masked with the gate electrode 109 and has not been implanted with the phosphorus ions 110 will be a channel region for a TFT.

Subsequently, as shown in FIG. 2(F), either a silicon dioxide film or a silicon nitrogen film is deposited as an interlevel dielectric film 119, contact holes are cut through the film, and the holes are filled with a metallic material to function as electrodes and interconnects 120 for a TFT.

Finally, the assembly is annealed at 350° C. for an hour within a nitrogen atmosphere or an atmosphere including hydrogen at the atmospheric pressure, thereby completing the TFT 121 shown in FIG. 2(F). Optionally, if necessary, the TFT 121 may be covered with a protective coating of silicon nitride, for example, to protect the TFT 121.

Figure 3:
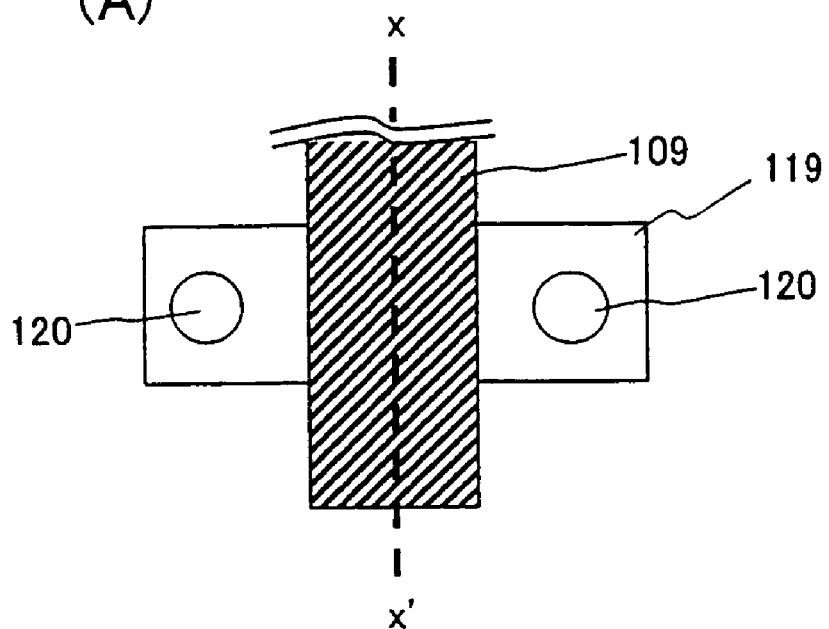
FIG. 3(A) is a top view of the gate electrode shown in FIG. 2(F) and FIG. 3(B) is a cross-sectional view thereof as viewed on the plane X-X' shown in FIG. 3(A).
Figure 3:
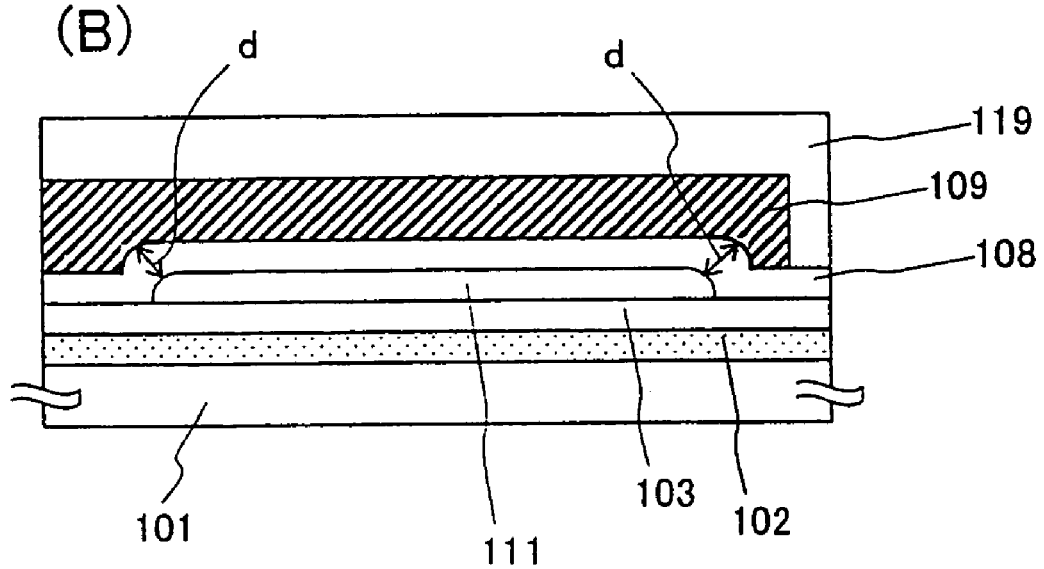

FIG. 3(A) is a top view of the gate electrode 109 shown in FIG. 2(F) and FIG. 3(B) is a cross-sectional view thereof as viewed on the plane X-X' shown in FIG. 3(A). As shown in FIG. 3(B), in the TFT fabricated by the process of this preferred embodiment, the channel region 111 has a gently curved shoulder portion, and therefore, the gate insulating film 108 also has a gently curved shoulder portion. That is why according to this preferred embodiment, the distance d from the shoulder portion of the channel region 111 to that of the gate insulating film 108 increases compared to a conventional TFT including a channel region 111 with a sharp shoulder portion. As a result, a TFT, in which the generation of leakage current is minimized and the gate insulating film has an increased breakdown voltage and an improved step coverage, can be obtained. Furthermore, since the TFTs fabricated by the process of this preferred embodiment have a uniform field effect mobility and constant off-state current, high-performance semiconductor devices are realized with the variation in TFT characteristic reduced significantly.

EXPERIMENTAL EXAMPLES

Hereinafter, a method of making a crystalline semiconductor film according to the present invention will be described in further detail by way of experimental examples.

First, an undercoat film of silicon dioxide was deposited to a thickness of about 300 nm to about 500 nm on a glass substrate by a plasma CVD process.

Next, an intrinsic (i-) amorphous silicon film was deposited to a thickness of 50 nm on the undercoat film by a plasma CVD process or a low-pressure CVD process. In this experimental example, a parallel plate plasma CVD system was used, the substrate was heated to a temperature of 300° C., the RF power density was set to 80 mW/cm$^2$, and $SiH_4$ and $H_2$ gases were used as source gases.

Subsequently, a very small amount of nickel was added onto the surface of the amorphous silicon film by holding a solution, in which nickel was dissolved, over the amorphous silicon film, applying the solution onto the substrate uniformly with a spinner, and then drying the solution. More specifically, nickel acetate was used as a solute, water was used as a solvent and the nickel concentration in the solution was adjusted to 10 ppm. In this case, the amount of the catalyst element added was extremely small and the concentration of the catalyst element on the surface of the a-Si film was controlled by the total reflection X-ray fluorescence (TRXRF) analysis and was approximately $4 \times 10^{12}$ atoms/cm$^2$ in this experimental example.

Thereafter, the amorphous silicon film was loaded into an electric furnace and heated to 600° C. for two hours within a nitrogen atmosphere. As a result of this heat treatment, the nickel that had been added onto the surface of the amorphous silicon film diffused into the amorphous silicon film and was also turned into a silicide, which acted as a nucleus for crystallizing the amorphous silicon film. Consequently, the amorphous silicon film was crystallized to be a first crystalline silicon film.

Subsequently, to repair its crystal defects, the first crystalline silicon film was irradiated with a laser beam within an oxidizing atmosphere. In this experimental example, the first crystalline silicon film was irradiated with 20 shots of XeCl (xenon chloride) excimer laser beams with a wavelength of 308 nm and an energy density of 350 mJ/cm$^2$.

Next, the first crystalline silicon film with the repaired crystal defects was patterned, thereby forming a first island-like crystalline silicon film (semiconductor layer). A dry etching process was carried out as the patterning process using $CF_4$ as an etching gas. The upper surface of the first island-like crystalline silicon film thus obtained had an Ra of 11 nm and a taper angle of 60 degrees and the average grain sizes of crystal grains in the edge and body portions were 3.6 μm and 3.5 μm, respectively. As a result of this process step, a first island-like crystalline silicon film (semiconductor layer) to be active regions for a TFT (i.e., source/drain regions and channel region) is obtained.

Thereafter, the first island-like crystalline silicon film (semiconductor layer) was further irradiated with a laser beam within a nitrogen gas atmosphere (i.e., second laser radiation process). In this experimental example, the first island-like crystalline silicon film was irradiated with 20 shots of XeCl (xenon chloride) excimer laser beams with a wavelength of 308 nm and an energy density of 350 mJ/cm$^2$. In the resultant second island-like crystalline silicon film, the upper surface had an Ra that had been reduced to 3 nm or less and the body and edge portions were joined together with a curved surface, thus forming a smooth shape. Even after this second laser radiation process, the average grain sizes of crystal grains in the edge and body portions had hardly changed from those measured just after the first laser radiation process and were 3.6 µm and 3.5 µm, respectively.

Subsequently, using the second island-like crystalline semiconductor film thus obtained, a TFT according to this experimental example was fabricated by the method of the preferred embodiment described above.

For the purpose of comparison, a TFT representing a comparative example was fabricated just as described above except that the second laser radiation process was carried-out before the first island-like crystalline silicon film (semiconductor layer) was patterned. This is a method corresponding to those disclosed in Patent Document Nos. 2, 3 and 4 mentioned above. According to this method, the island-like crystalline silicon film obtained by the patterning process had a trapezoidal cross section in which the junction between the upper and side surfaces had a sharp edge.

Next, to measure the transistor breakdown voltages of the respective TFTs fabricated in this manner, the amounts of leakage current flowing through the gate insulating film were measured with the voltage between the gate electrode and Si (i.e., the gate voltage) changed. The results are shown in FIG. 6.

Figure 6:
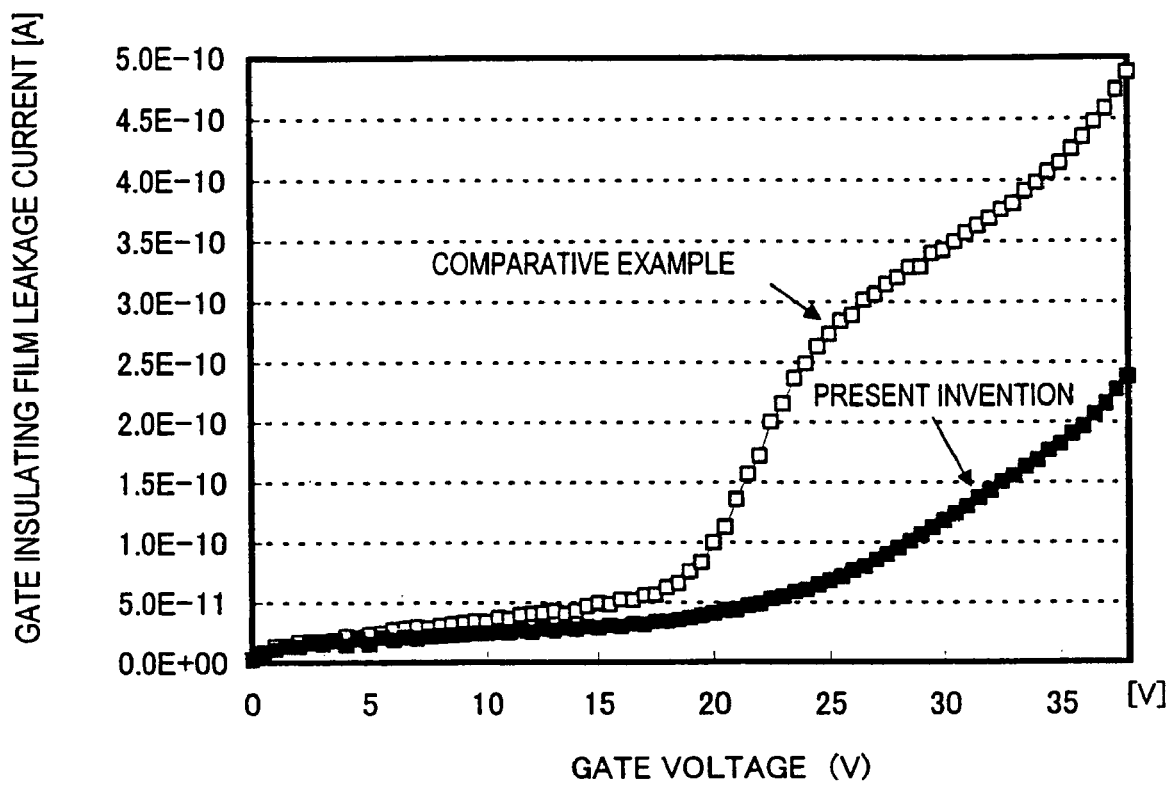
FIG. 6 is a graph showing the transistor breakdown voltages of a TFT of the present invention and a TFT representing a comparative example that were made as experimental examples.

As shown in FIG. 6, in the TFT of the comparative example, the higher the gate voltage, the greater the amount of leakage current generated. On the other hand, in the TFT of the present invention, the generation of leakage current was not so significant even if the gate voltage was increased.

INDUSTRIAL APPLICABILITY

According to the present invention, the generation of leakage current can be reduced significantly, the gate insulating film can have an increased breakdown voltage or improved step coverage, and the field effect mobilities and off-state currents of the TFTs can have increased uniformity, thus realizing high-performance semiconductor devices. As a result, semiconductor devices with reduced power dissipation and enhanced performance can be provided.

The crystalline semiconductor film of the present invention can be used effectively in TFTs for flat-panel displays such as LCDs and organic and inorganic EL displays. The crystalline semiconductor film can also find applications in other types of semiconductor devices as well.

The invention claimed is:

1. A crystalline semiconductor film including islands of a crystalline semiconductor that are dispersed over a substrate,
   wherein each said island of the crystalline semiconductor has an upper surface of crystalline semiconductor and a sloped side surface of crystalline semiconductor, which are joined together with a curved surface of crystalline semiconductor, and
   wherein crystal grains in a body portion of the island, including the upper surface, and crystal grains in an edge portion of the island, including the sloped side surface, both have average grain sizes that are greater than 0.2 µm.

2. The crystalline semiconductor film of claim 1, wherein the crystal grains in the body portion and the crystal grains in the edge portion both have average grain sizes falling within the range of 1 µm to 10 µm.

3. The crystalline semiconductor film of claim 1, wherein the average grain size of the crystal grains in the body portion is substantially equal to that of the crystal grains in the edge portion.

4. The crystalline semiconductor film of claim 1, wherein the upper surface is substantially flat.

5. The crystalline semiconductor film of claim 4, wherein the upper surface has a centerline average roughness Ra of 5 nm or less.

6. A method of making a crystalline semiconductor film, comprising the steps of:
   (a) forming a first crystalline semiconductor film on a substrate;
   (b) patterning the first crystalline semiconductor film into a first island-like crystalline semiconductor film; and
   (c) melting and re-crystallizing the first island-like crystalline semiconductor film, thereby turning the first island-like crystalline semiconductor film into a second island-like crystalline semiconductor film
   wherein the step (c) includes irradiating the first island-like crystalline semiconductor film with a light ray and wherein step (c) is performed substantially in a vacuum or in an atmosphere including an inert gas;
   wherein said second island-like crystalline semiconductor film has an upper surface of crystalline semiconductor and a sloped side surface of crystalline semiconductor, which are joined together with a curved surface of crystalline semiconductor, and
   wherein crystal grains in a body portion of the second island-like crystalline semiconductor film including the upper surface, and crystal grains in an edge portion of the second island-like crystalline semiconductor film, including the sloped side surface, both have average grain sizes that are greater than 0.2 µm.

7. The method of claim 6, wherein the step (a) includes the steps of:
   (a1) forming an amorphous semiconductor film on the substrate; and (a2) crystallizing the amorphous semiconductor film to make the first crystalline semiconductor film.

8. The method of claim 7, wherein the step (a2) includes irradiating the amorphous semiconductor film with a light ray.

9. The method of claim 7, further comprising the step of (a3) adding a catalyst element that promotes crystallization to the amorphous semiconductor film between the steps (a1) and (a2).

10. The method of claim 9, wherein the step (a2) includes thermally treating the amorphous semiconductor film.

11. The method of claim 9, wherein the step (a3) includes adding at least one element selected from the group consisting of Ni, Co, Pd, Pt, Cu, Ag, Au, In, Sn, Al and Sb as the catalyst element.

12. The method of claim 11, wherein the step (a3) includes adding Ni as the catalyst element.

13. The method of claim 9, wherein the step (a3) includes inducing crystal growth using a semiconductor compound of the catalyst element as crystal nuclei.

14. The method of claim 13, wherein the amorphous semiconductor film is made essentially of silicon and the semiconductor compound of the catalyst element is a silicide.

15. The method of claim 6, further comprising the step of (d) melting and re-crystallizing the first crystalline semiconductor film that has been formed in the step (a) before the step (b) is performed.

16. The method of claim 6, wherein the inert gas is either a rare gas or nitrogen gas.

17. The method of claim 15, wherein the step (d) includes irradiating the first crystalline semiconductor film that has been formed in the step (a) with a light ray.

18. The method of claim 17, wherein the step (d) is performed in an atmosphere including oxygen.

19. The method of claim 8, wherein the light ray is a laser beam.

20. A crystalline semiconductor film made by the method of claim 6.

21. A semiconductor device comprising a crystalline semiconductor film including islands of a crystalline semiconductor that are dispersed over a substrate, wherein each said island of the crystalline semiconductor has an upper surface of crystalline semiconductor and a sloped side surface of crystalline semiconductor, which are joined together with a curved surface of crystalline semiconductor, and wherein crystal grains in a body portion of the island, including the upper surface, and crystal grains in an edge portion of the island, including the sloped side surface, both have average grain sizes that are greater than 0.2 µm.

22. A display device comprising a semiconductor device including a crystalline semiconductor film having islands of a crystalline semiconductor that are dispersed over a substrate, wherein each said island of the crystalline semiconductor has an upper surface of crystalline semiconductor and a sloped side surface of crystalline semiconductor, which are joined together with a curved surface of crystalline semiconductor, and wherein crystal grains in a body portion of the island, including the upper surface, and crystal grains in an edge portion of the island, including the sloped side surface, both have average grain sizes that are greater than 0.2 µm.

* * * * *